(12) United States Patent
Takaishi

(10) Patent No.: US 7,598,586 B2
(45) Date of Patent: Oct. 6, 2009

(54) SEMICONDUCTOR DEVICE AND PRODUCTION METHOD THEREFOR

(75) Inventor: Masaru Takaishi, Kyoto (JP)

(73) Assignee: ROHM Co., Ltd., Kyoto (JP)

( * ) Notice: Subject to any disclaimer, the term of this patent is extended or adjusted under 35 U.S.C. 154(b) by 434 days.

(21) Appl. No.: 10/577,361

(22) PCT Filed: Dec. 24, 2004

(86) PCT No.: PCT/JP2004/019740

§ 371 (c)(1),
(2), (4) Date: Apr. 28, 2006

(87) PCT Pub. No.: WO2005/064685

PCT Pub. Date: Jul. 14, 2005

(65) Prior Publication Data

US 2007/0080399 A1    Apr. 12, 2007

(30) Foreign Application Priority Data

Dec. 26, 2003    (JP) .......................... 2003-435265

(51) Int. Cl.
    *H01L 29/72*    (2006.01)
(52) U.S. Cl. .................. 257/492; 257/493; 257/496; 438/140; 438/259; 438/270
(58) Field of Classification Search .............. 257/492, 257/493, 496; 438/140, 259, 270
    See application file for complete search history.

(56) References Cited

U.S. PATENT DOCUMENTS

| | | |
|---|---|---|
| 4,754,310 A | 6/1988 | Coe |
| 5,216,275 A | 6/1993 | Chen |
| 5,391,506 A | 2/1995 | Tada et al. |
| 5,438,215 A | 8/1995 | Tihanyi |
| 6,307,246 B1 | 10/2001 | Nitta et al. |
| 2002/0070418 A1 | 6/2002 | Kinzer et al. |
| 2002/0175368 A1 | 11/2002 | Izumisawa et al. |
| 2002/0185705 A1* | 12/2002 | Saitoh et al. ............ 257/492 |
| 2005/0170587 A1 | 8/2005 | Izumisawa et al. |

FOREIGN PATENT DOCUMENTS

| | | |
|---|---|---|
| EP | 1 168 455 A2 | 1/2002 |
| JP | 57-124469 | 8/1982 |

(Continued)

OTHER PUBLICATIONS

Saggio M et al: "MDMESH™: Innovative Technology for High Voltage PowerMOSFETS" Proceedings of the International Symposium on Powersemiconductor Devices and ICS, New York, NY, US, May 22, 2000, pp. 65-68, XP00985371.

*Primary Examiner*—Edward Wojciechowicz
(74) *Attorney, Agent, or Firm*—Rabin & Berdo, PC

(57) ABSTRACT

A semiconductor device, including: a semiconductor substrate of a first conductivity; and a semiconductor layer provided on the semiconductor substrate and having a super junction structure including drift layers of the first conductivity and RESURF layers of a second conductivity different from the first conductivity, the drift layers and the RESURF layers being laterally arranged in alternate relation parallel to the semiconductor substrate, the RESURF layers being each provided alongside an interior side wall of a trench penetrating through the semiconductor layer, the drift layers each having an isolation region present between the RESURF layer and the semiconductor substrate to prevent the RESURF layer from contacting the semiconductor substrate.

14 Claims, 5 Drawing Sheets

FOREIGN PATENT DOCUMENTS

| | | |
|---|---|---|
| JP | 63-58960 | 3/1988 |
| JP | 1-196859 | 8/1989 |
| JP | 5-218415 | 8/1993 |
| JP | 7-7154 | 1/1995 |
| JP | 2000-277733 | 10/2000 |
| JP | 2002-217415 | 8/2002 |
| JP | 2003-46082 | 2/2003 |
| JP | 2003-101022 | 4/2003 |
| WO | WO 00/05767 | 2/2000 |

* cited by examiner

US 7,598,586 B2

SEMICONDUCTOR DEVICE AND PRODUCTION METHOD THEREFOR

TECHNICAL FIELD

The present invention relates to a semiconductor device having a so-called super junction structure and to a production method therefor.

BACKGROUND ART

An attempt has been made to increase the breakdown voltage of a semiconductor device including a MOS field effect transistor (metal oxide semiconductor field effect transistor, MOS FET).

FIG. 5 is a schematic sectional view of a prior art semiconductor device including MOS FETs (see Japanese Unexamined Patent Publication No. 2003-46082).

A semiconductor layer 54 including N-type drift layers (N-type pillar layers) 52 and P-type RESURF (reduced surface field) layers (P-type pillar layers) 53 is provided on an $N^{++}$-type semiconductor substrate 51. The drift layers 52 and the RESURF layers 53 are recurrently arranged in alternate relation in a direction parallel to the semiconductor substrate 51 to provide a so-called super junction structure.

A plurality of trenches 55 are provided in the semiconductor layer 54 as extending thicknesswise of the semiconductor layer 54 and having a depth such as to reach an interface between the semiconductor substrate 51 and the semiconductor layer 54. The trenches 55 each have interior side walls generally perpendicular to the semiconductor substrate 51, and are generally equidistantly arranged parallel to each other. The interior walls of the trenches 55 are each covered with an oxide film 63, and the insides of the trenches 55 are each filled with a buried layer 64 such as of polysilicon or a dielectric material.

The drift layers 52 are each disposed alongside the trench 55. The RESURF layers 53 are each disposed between a pair of drift layers 52 disposed alongside each adjacent pair of trenches 55. The RESURF layer 53 contacts the pair of drift layers 52 and the semiconductor substrate 51.

N-type regions 56 are each provided on the drift layer 52. P-type base layers 57 are each provided on the RESURF layer 53 in contact with the adjacent N-type regions 56. N-type source regions 58 are provided in a surface portion of each of the base layers 57.

Gate electrodes 60 are each disposed in opposed relation to a region including portions of the base layers 57 between the N-type regions 56 and the source regions 58 with the intervention of an insulative film 59. A source electrode 61 is provided in contact with the source regions 58 and the base layers 57. A drain electrode 62 is provided on a back surface of the semiconductor substrate 51 (opposite from a surface of the semiconductor substrate formed with the gate electrodes 60 and the source electrode 61).

The semiconductor device is used in such a state that, with one of the source electrode 61 and the drain electrode 62 connected to an external load, a predetermined voltage from a power source is applied between the external load and the other of the source electrode 61 and the drain electrode 62. The applied voltage provides a reverse bias to PN junctions defined between the RESURF layers 53 and the drift layers 52.

In this state, the gate electrodes 60 are kept at a proper potential (the MOS FETs are turned on), whereby electric currents flow between the source electrode 61 and the drain electrode 62. At this time, channels are formed in the portions of the base layers 57 between the N-type regions 56 and the source regions 58 in the vicinity of interfaces between the insulative films 59 and the base layers 57. Thus, the electric currents flow from the drain electrode 62 to the source electrode 61 through the semiconductor substrate 51, the drift layers 52, the N-type regions 56, the portions of the base layers 57 adjacent to the interfaces between the insulative films 59 and the base layers 57 (the channels) and the source regions 58.

At this time, a reverse bias resulting from voltage division between the external load and the ON-resistances of the MOS FETs is applied to the PN junctions defined between the RESURF layers 53 and the drift layers 52. However, depletion layers occurring due to the reverse bias spread to a negligible extent, so that carrier (electron) paths are present in the respective drift layers 52.

Next, an explanation will be given to a state to be observed when the MOS FETs are off, i.e., when the gate electrodes 60 are not kept at the proper potential. In this case, the channels are not formed, so that no electric current flows in the MOS FETs. Therefore, the whole source voltage is applied as a reverse bias to the PN junctions defined between the drift layers 52 and the RESURF layers 53. Hence, the depletion layers immediately spread into the drift layers 52 and the RESURF layers 53 from interfaces S between the drift layers 52 and the RESURF layers 53, whereby the drift layers 52 and the RESURF layers 53 are completely depleted. This theoretically realizes a higher breakdown voltage.

However, the RESURF layers 53 also contact the semiconductor substrate 51 of the $N^{++}$-type conductivity. Therefore, when the reverse bias voltage is applied to the PN junctions defined between the drift layers 52 and the RESURF layers 53, depletion layers also spread into the RESURF layers 53 and the semiconductor substrate 51 from interfaces between the RESURF layers 53 and the semiconductor substrate 51.

At this time, the depletion layers spread in regions adjacent to the interfaces between the drift layers 52 and the RESURF layers 53 and in regions adjacent to the interfaces between the semiconductor substrate 51 and the RESURF layers 53 in different manners, because the semiconductor substrate 51 and the drift layers 52 have different impurity concentrations. Therefore, when the semiconductor device is off, strong electric fields locally occur in the depletion layers, so that the electric currents flow in strong electric field regions. Therefore, the breakdown voltage of the semiconductor device is not satisfactory in practice.

DISCLOSURE OF THE INVENTION

It is an object of the present invention to provide a semiconductor device having an increased breakdown voltage.

It is another object of the present invention to provide a production method for a semiconductor device having an increased breakdown voltage.

The inventive semiconductor device comprises a semiconductor substrate of a first conductivity, and a semiconductor layer provided on the semiconductor substrate and having a super junction structure including drift layers of the first conductivity and RESURF layers of a second conductivity different from the first conductivity, the drift layers and the RESURF layers being laterally arranged in alternate relation in a direction parallel to the semiconductor substrate. The RESURF layers are each provided alongside an interior side wall of a trench penetrating through the semiconductor layer. The drift layers each have an isolation region present between the RESURF layer and the semiconductor substrate to prevent the RESURF layer from contacting the semiconductor substrate.

When a reverse bias voltage is applied to PN junctions defined between the drift layers and the RESURF layers in the inventive semiconductor device, depletion layers spread into the drift layers and the RESURF layers from interfaces between the drift layers and the RESURF layers (hereinafter referred to simply as "interfaces"). In this case, when the applied voltage is increased to not lower than a predetermined level, the drift layers and the RESURF layers are almost completely depleted. Therefore, the semiconductor device has a predetermined breakdown voltage (e.g., several hundreds volts).

The drift layers and the RESURF layers are alternately (recurrently) arranged parallel to the semiconductor substrate. The drift layers are each partly present between the RESURF layer and the semiconductor substrate, so that the RESURF layer does not directly contact the semiconductor substrate. That is, semiconductor portions having a generally even impurity concentration are present between the RESURF layer and the semiconductor substrate and between the RESURF layer and the trench or between two adjacent RESURF layers in each of the drift layers.

Therefore, the depletion layers uniformly spread from the interfaces in the drift layers. That is, the depletion layers equally spread toward the trenches opposed to the interfaces with the intervention of the drift layers (parallel to the semiconductor substrate), and toward the semiconductor substrate opposed to the interfaces with the intervention of the drift layers (perpendicularly to the semiconductor substrate) in the drift layers from the interfaces. Therefore, strong electric fields do not locally occur in the depletion layers, so that the electric currents do not easily flow through the interfaces. That is, the semiconductor device has an increased breakdown voltage (e.g., 200V to 1000V) as compared with the prior art semiconductor device.

Since the RESURF layers are provided alongside the interior side walls of the trenches each penetrating through the semiconductor layer, the formation of the RESURF layers can be easily achieved by introducing an impurity of the second conductivity (an impurity for control of impartation with the second conductivity) into the interior side walls of the trenches.

The RESURF layers may each be provided alongside one of widthwise opposite interior side walls of the trench. In this case, the drift layers may each be provided a long side the other of the widthwise opposite interior side walls of the trench. In this case, the width of a portion of the drift layer between the trench and the RESURF layer as measured laterally may be nearly equal to the width of the isolation region as measured vertically depthwise of the trench.

With this arrangement, the width of the portion of the drift layer between the RESURF layer and the trench as measured laterally is nearly equal to the width of the isolation region (between the RESURF layer and the semiconductor substrate) as measured vertically. Thus, the depletion layers spread to the same width toward the trenches and toward the semiconductor substrate in the drift layers from the interfaces. Therefore, the electric fields in the depletion layers each constantly have an even intensity, so that the semiconductor device has a higher breakdown voltage.

Further, the RESURF layers may be provided alongside widthwise opposite interior side walls of the trenches. In this case, the width of a portion of the drift layer between the two adjacent RESURF layers as measured laterally is generally double the width of the isolation region as measured vertically depthwise of the trench.

With this arrangement, the width of the portion of the drift layer between the two adjacent RESURF layers as measured laterally is generally double the width of the isolation region as measured vertically (the width of the portion between the RESURF layer and the semiconductor substrate). Thus, the depletion layers spread to the same width toward the adjacent RESURF layers (or trenches) and toward the semiconductor substrate in the drift layers from the interfaces. Therefore, the electric fields in the depletion layers each constantly have an even intensity, so that the semiconductor device has a higher breakdown voltage.

The semiconductor device may further comprise base regions of the second conductivity each provided in contact with the drift layer and the RESURF layer, source regions of the first conductivity each provided in contact with the base region and isolated from the drift layer and the RESURF layer by the base region, and gate electrodes each provided in opposed relation to a portion of the base region between the source region and the drift layer with the intervention of a gate insulation film.

In the semiconductor device having this arrangement, channels are formed in portions of the base regions between the source regions and the drift layers in the vicinity of the gate insulation films by keeping the gate electrode at a predetermined potential (the semiconductor device is turned on) while a voltage of a proper level is applied between the source regions and the semiconductor substrate (drain region). Thus, electric currents flow between the source regions and the semiconductor substrate.

Even if a higher reverse bias voltage is applied to the PN junctions defined between the drift layers and the RESURF layers when the semiconductor device is off, the semiconductor device has a higher breakdown voltage.

The semiconductor device may be of a planar type, in which the drift layer, the base region and the source region are arranged parallel to the semiconductor substrate in a region where the base region is opposed to the gate electrode. The semiconductor device may be of a so-called trench gate type, in which the gate electrode is disposed in the trench formed perpendicularly to the semiconductor substrate, and the drift layer, the base region and the source region are arranged depthwise of the trench in a region where the base region is opposed to the gate electrode.

A semiconductor device production method according to a first aspect of the present invention is a production method for a semiconductor device which includes a semiconductor layer provided on a semiconductor substrate of a first conductivity and having a super junction structure including drift layers of the first conductivity and RESURF layers of a second conductivity different from the first conductivity, the drift layers and the RESURF layers being laterally arranged in alternate relation in a direction parallel to the semiconductor substrate. The production method comprises the steps of: forming a semiconductor layer of the first conductivity on a semiconductor substrate of the first conductivity; performing a first trench formation process to form a trench in the semiconductor layer, the trench having a depth such as to reach the middle of the semiconductor layer; after the first trench formation step, performing an in-trench impurity introduction process to introduce an impurity of the second conductivity into a portion of the semiconductor layer exposed to an interior side wall of the trench for forming a RESURF layer of the second conductivity alongside the interior side wall of the trench; and, after the in-trench impurity introduction step, performing a second trench formation process to deepen the trench to a depth such as to penetrate through the semiconductor layer to reach the semiconductor substrate.

The drift layers may each be defined by a portion of the semiconductor layer remaining intact after the formation of the RESURF layer.

According to this semiconductor device production method, the trench has a depth such as not to reach the semiconductor substrate and, therefore, the impurity of the second conductivity is not introduced into a portion of the semiconductor layer adjacent to the semiconductor substrate in the in-trench impurity introduction step. Thus, the RESURF layer is provided as isolated from the semiconductor substrate by the drift layer (the remaining portion of the semiconductor layer).

The in-trench impurity introduction step may include the step of performing an implantation process to implant the impurity of the second conductivity into a surface portion of the semiconductor layer exposed to the interior side wall of the trench. In this case, the formation of the RESURF layer may be achieved by performing a thermal diffusion process to heat the resulting semiconductor substrate after the implantation step for diffusing the implanted impurity into the semiconductor layer. In this case, the implantation step is performed after the first trench formation step before the second trench formation step, and the thermal diffusion step may be performed, for example, after the second trench formation step.

The in-trench impurity introduction step may include the step of introducing the impurity of the second conductivity only into one of widthwise opposite interior side walls of the trench. Thus, the RESURF layer is provided alongside the one of the widthwise opposite interior side walls of the trench. Alternatively, the in-trench impurity introduction step may include the step of introducing the impurity of the second conductivity into widthwise opposite interior side walls of the trench. Thus, the RESURF layers are provided alongside the widthwise opposite interior side walls of the trench.

The width of a portion (isolation region) of the drift layer of the resulting semiconductor device between the RESURF layer and the semiconductor substrate as measured vertically can be controlled by controlling the depth of the trench to be formed in the first trench formation step. Where the in-trench impurity introduction step includes the thermal diffusion step, the width of a portion of the drift layer between the RESURF layer and the trench or between adjacent RESURF layers as measured laterally can be controlled by controlling conditions for heating the resulting semiconductor substrate (e.g., a temperature and a period for the heating).

A semiconductor device production method according to a second aspect of the present invention is a production method for a semiconductor device which includes a semiconductor layer provided on a semiconductor substrate of a first conductivity and having a super junction structure including drift layers of the first conductivity and RESURF layers of a second conductivity different from the first conductivity, the drift layers and the RESURF layers being laterally arranged in alternate relation in a direction parallel to the semiconductor substrate. The production method comprises the steps of: forming a semiconductor layer of the first conductivity on a semiconductor substrate of the first conductivity; forming a trench in the semiconductor layer, the trench penetrating through the semiconductor layer to reach the semiconductor substrate; and performing an in-trench impurity introduction process to implant an impurity of the second conductivity at an inclination angle into a portion of the semiconductor layer exposed to an interior side wall of the trench for forming a RESURF layer of the second conductivity in the portion of the semiconductor layer alongside the interior side wall of the trench, the inclination angle being such that the impurity reaches a limited depthwise range of the interior side wall of the trench shallower than the semiconductor substrate.

According to this inventive aspect, the impurity of the second conductivity is implanted to reach the depthwise range of the interior side wall of the trench shallower than the semiconductor substrate for the formation of the RESURF layer. Thus, the RESURF layer is provided as isolated from the semiconductor substrate by the drift layer. The drift layers may be each defined by a portion of the semiconductor layer remaining intact after the formation of the RESURF layer.

The in-trench impurity introduction step may include the step of introducing the impurity of the second conductivity only into one of widthwise opposite interior side walls of the trench, or the step of introducing the impurity of the second conductivity into the widthwise opposite interior side walls of the trench.

The width of a portion (isolation region) of the drift layer of the resulting semiconductor device between the RESURF layer and the semiconductor substrate as measured vertically can be controlled by controlling the angle of the implantation of the impurity of the second conductivity with respect to the interior side wall of the trench. Where the semiconductor device production method includes a thermal diffusion step, the width of a portion of the drift layer between the RESURF layer and the trench or between adjacent RESURF layers as measured laterally can be controlled by controlling conditions for heating the semiconductor substrate (e.g., a temperature and a period for the heating).

The inventive semiconductor device production method may further comprise the steps of: introducing an impurity of the second conductivity in a surface portion of the semiconductor layer to form a base region of the second conductivity in contact with the RESURF layer; introducing an impurity of the first conductivity into a portion of the base region to form a source region of the first conductivity which is isolated from the drift layer and the RESURF layer by a remaining portion of the base region; forming a gate insulation film opposed to the portion of the base region between the source region and the drift layer; and forming a gate electrode opposed to the portion of the base region between the source region and the drift layer with the intervention of the gate insulation film.

The foregoing and other objects, features and effects of the present invention will become more apparent from the following description of the embodiments with reference to the attached drawings.

EMBODIMENTS OF THE INVENTION

Figure 1:
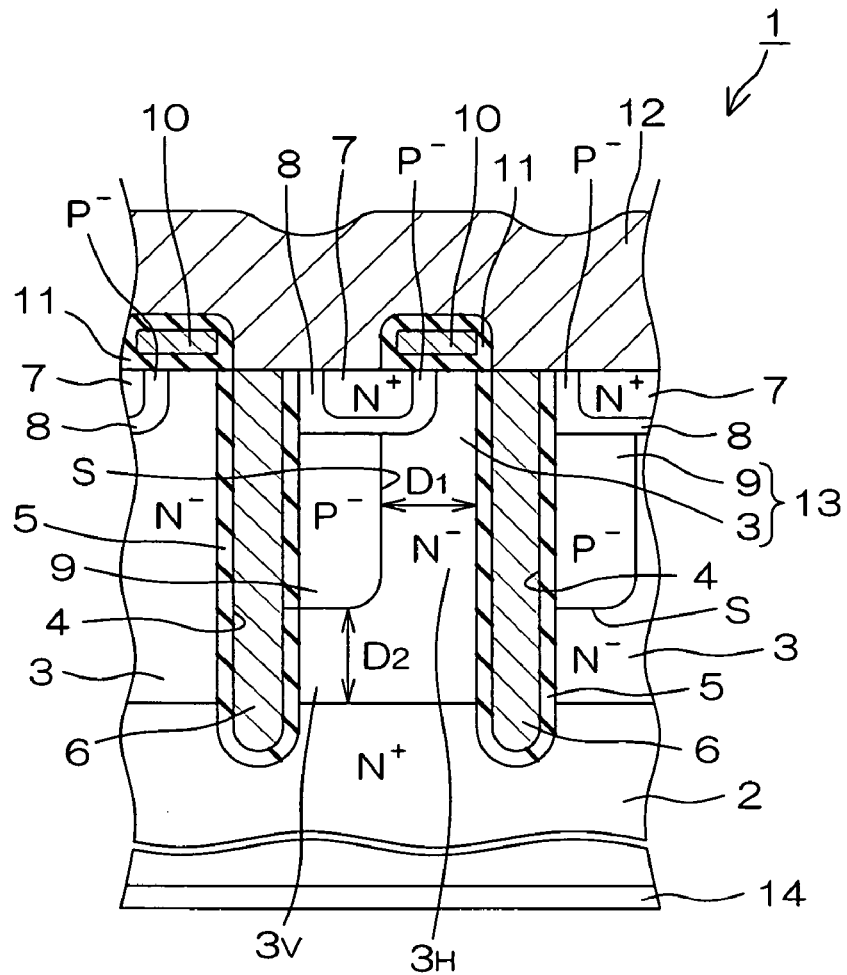
FIG. 1 is a schematic sectional view illustrating the construction of a semiconductor device according to a first embodiment of the present invention.

FIG. 1 is a schematic sectional view illustrating the construction of a semiconductor device 1 according to a first embodiment of the present invention.

A semiconductor layer 13 having a so-called super junction structure is provided on a silicon substrate 2 of an $N^+$-type conductivity serving as a drain region. The semiconductor layer 13 includes drift layers 3 of an $N^-$-type conductivity and RESURF layers 9 of a $P^-$-type conductivity laterally alternately (recurrently) arranged in a direction parallel to the silicon substrate 2.

A plurality of trenches 4 are provided generally parallel to each other as penetrating through the semiconductor layer 13 and having a depth such as to reach the silicon substrate 2. The trenches 4 each have interior side walls generally perpendicular to the silicon substrate 2, and extend perpendicularly to a paper face of FIG. 1. That is, the trenches 4 each have a length perpendicular to the paper face of FIG. 1, and a width parallel to the paper face of FIG. 1 and parallel to the silicon substrate 2.

Although only two trenches 4 are shown in FIG. 1, the semiconductor device 1 has a greater number of trenches 4, which are equidistantly arranged.

Silicon oxide films 5 are provided on the interior walls of the respective trenches 4, and the insides of the trenches 4 are filled with polysilicon 6.

The RESURF layers 9 are each disposed alongside an interior side wall of the trench 4 on one of widthwise opposite sides of the trench. That is, the RESURF layer 9 is disposed between two adjacent trenches 4 in the vicinity of one of these trenches 4 in contact with the silicon oxide film 5. The drift layers 3 are each disposed parallel to the RESURF layer 9 between two adjacent RESURF layers 9 (between the RESURF layer 9 and the trench 4) alongside an interior side wall of the trench 4 on the other widthwise side of the trench.

Further, the drift layer 3 is partly present below the RESURF layer 9 (between the silicon substrate 2 and the RESURF layer 9). That is, the RESURF layer 9 is isolated from the silicon substrate 2 by the drift layer 3, so that the RESURF layer 9 does not contact the silicon substrate 2.

A portion $3_H$ of the drift layer 3 defined between the RESURF layer 9 and the trench 4 is continuous to a portion $3_V$ (herein after referred to as "isolation region") of the drift layer 3 defined between the RESURF layer 9 and the silicon substrate 2 (drain region). The width $D_1$ of the portion $3_H$ between the RESURF layer 9 and the trench 4 as measured laterally is nearly equal to the width $D_2$ of the isolation region $3_V$ as measured vertically depthwise of the trench 4. The drift layer 3 has a generally uniform impurity concentration, so that the portion $3_H$ between the RESURF layer 9 and the trench 4 and the isolation region $3_V$ have substantially the same impurity concentration.

A source region 7 of an $N^+$-type conductivity is provided in a surface portion of the semiconductor layer 13 (opposite from the silicon substrate 2) adjacent to the trench 4 on the one side of the trench 4 (adjacent to the RESURF layer 9). A base region 8 of a $P^-$-type conductivity is present between the source region 7 and the drift layer 3, between the source region 7 and the RESURF layer 9 and between the source region 7 and the silicon oxide film 5.

A gate electrode 10 is disposed on the surface of the semiconductor layer 13 in opposed relation to a portion of the base region 8 between the drift layer 3 and the source region 7, and portions of the drift layer 3 and the source region 7 adjacent to this portion. The gate electrode 10 is composed of polysilicon imparted with electrical conductivity by introduction of an impurity. The gate electrode 10 is covered with a silicon oxide film 11. Therefore, the gate electrode 10 is isolated from the base region 8 by the silicon oxide film 11.

A source electrode 12 of aluminum is provided on a surface of the silicon substrate 2 formed with the drift layers 3 and the RESURF layers 9. The source electrode 12 is electrically connected to the source region 7 and the base region 8. A drain electrode 14 is provided on a back surface of the silicon substrate 2 (opposite from the source electrode 12).

The semiconductor device 1 is used in such a state that, with one of the source electrode 12 and the drain electrode 14 connected to an external load, a predeterminate voltage (e.g., several hundreds volts) from a power source is applied between the external load and the other of the source electrode 12 and the drain electrode 14. The applied voltage provides a reverse bias to PN junctions defined between the RESURF layers 9 and the drift layers 3.

In this state, the gate electrodes 10 are kept at a predetermined potential (the semiconductor device 1 is turned on), whereby electric currents flow between the source electrode 12 and the drain electrode 14. At this time, channels are formed in the portions of the base regions 8 between the drift layers 3 and the source regions 7 adjacent to the interfaces between the silicon oxide films 11 and the base regions 8.

At this time, are verse bias (e.g., 2V) resulting from voltage division between the external load and the ON-resistances of MOS FETs is applied to the PN junctions fined between the RESURF layers 9 and the drift layers 3. However, depletion layers occurring due to the reverse bias spread to a negligible extent, so that carrier (electron) paths are present in the drift layers 3. In the semiconductor device 1 in the ON state, the electric currents flow between the source electrode 12 and the drain electrode 14 through non-depleted portions of the drift layers 3.

On the other hand, when the semiconductor device 1 is off, i.e., when the gate electrodes 10 are not kept at the predetermined potential, the channels are not formed, so that no electric current flows in the MOS FETs. Therefore, the whole source voltage is applied as a reverse bias to the PN junctions defined between the drift layers 3 and the RESURF layers 9. Hence, the depletion layers immediately spread into the drift layers 3 and the RESURF layers 9 from interfaces S between the drift layers 3 and the RESURF layers 9. In the drift layers 3, the depletion layers spread from the interfaces S toward the trenches 4 opposed to the interfaces S with the intervention of the drift layers 3 and toward the silicon substrate 2 opposed to the interfaces S with the intervention of the drift layers 3.

Even if the drift layers 3 each have a higher impurity concentration, complete depletion of the drift layers 3 and the RESURF layers 9 can be easily achieved by reducing the widths D1, D2 of the respective portions of the drift layers 3 and the width of the RESURF layers 9. Further, the ON-resistances can be reduced by increasing the impurity concentrations of the drift layers 3 defining parts of the electric conduction paths in the ON state.

Since the width D1 is nearly equal to the width D2 in the drift layers 3, the depletion layers spread to the same width toward the adjacent trenches 4 and toward the silicon substrate 2 in the drift layers 3 from the interfaces S. Thus, the electric fields in the depletion layers each constantly have an even intensity, and are free from locally high intensity. Therefore, the electric currents do not easily flow through the interfaces S, so that the semiconductor device 1 has a higher breakdown voltage.

The semiconductor device 1 typically has a breakdown voltage of about 200V to about 1000V. Where the semiconductor device has a breakdown voltage of 600V, for example, the semiconductor device has an ON-resistance which is about one fifth of that of the prior art semiconductor device.

FIGS. 2(a), 2(b), 2(c), 2(d) and 2(e) are schematic sectional views for explaining a production method for the semiconductor device 1 of FIG. 1.

First, an epitaxial layer 15 of the N⁻-type conductivity is formed on a silicon substrate 2 of the N⁺-type conductivity, and a hard mask 21 having openings 21a formed in predetermined positions corresponding to the trenches 4 of the semiconductor device 1 is formed on the epitaxial layer 15. The hard mask 21 is composed of, for example, silicon oxide or silicon nitride.

Then, the epitaxial layer 15 is dry-etched through the openings 21a of the hard mask 21 (for example, by reactive ion etching), whereby trenches 22 are formed as having a depth such as to reach a thicknesswise middle portion of the epitaxial layer 15 but not to reach the silicon substrate 2 (first trench formation step).

At this time, a distance between the bottom of each of the trenches 22 and the silicon substrate 2 is nearly equal to the width $D_2$ of the isolation region $3_V$ of the drift layer 3 of the semiconductor device 1 as measured vertically (the width of the portion between the RESURF layer 9 and the silicon substrate 2 (drain region)) (see FIG. 1). The trenches 22 each have a width of, for example, about 2 μm, and a depth of, for example, about 40 μm.

Subsequently, impurity ions for control of impartation with a P-type conductivity are implanted into portions of the epitaxial layer 15 exposed to interior surfaces of the trenches 22 through the openings 21a of the hard mask 21. At this time, the ions are implanted at a predetermined angle (inclination angle) with respect to interior side walls of the trenches 22 perpendicular to the widths of the trenches 22 (which are parallel to a paper face of FIG. 2(a) and parallel to the silicon substrate 2) as indicated by arrows A in FIG. 2(a). The angle of an ion implantation direction with respect to the interior side walls of the trenches 22 (with respect to a direction normal to the silicon substrate 2) is, for example, 1.5 degrees to 2 degrees.

Figure 2A:
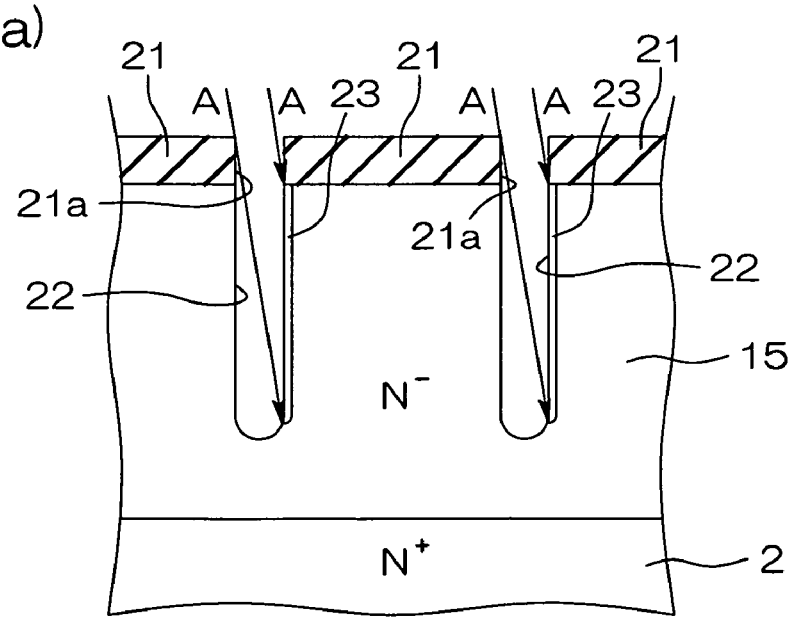
FIGS. 2(a) to 2(e) are schematic sectional views for explaining a production method for the semiconductor device of FIG. 1.

Thus, a first implanted region 23 implanted with the P-type impurity is formed in substantially the entire interior side wall of each of the trenches 22 on one of widthwise opposite sides of the trench 22 (corresponding to a side of the trench 4 of the semiconductor device 1 where the RESURF layer 9 is provided in proximity to the trench). This state is shown in FIG. 2(a).

Figure 2B:
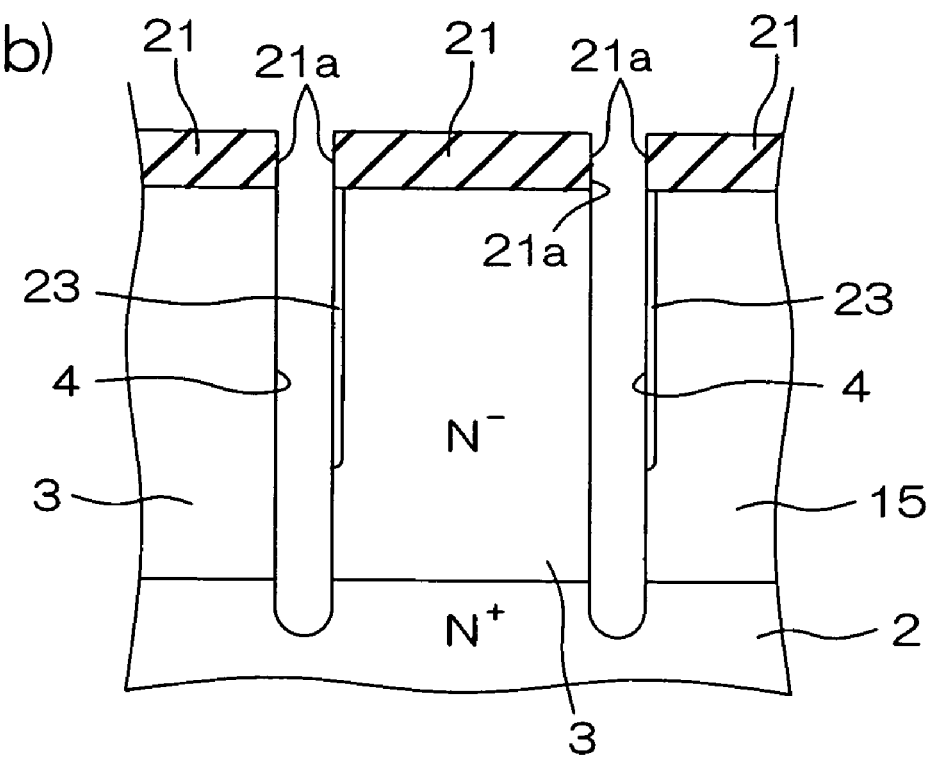

Next, the epitaxial layer 15 is further dry-etched through the openings 21a of the hard mask 21. Thus, the trenches 22 are further deepened, whereby trenches 4 are formed as each having a depth such as to reach the silicon substrate 2 (second trench formation step). This state is shown in FIG. 2(b). Thereafter, the hard mask 21 is removed, and a resist film (not shown) having openings formed in positions corresponding to the base regions 8 is formed on the epitaxial layer 15.

Figure 2C:
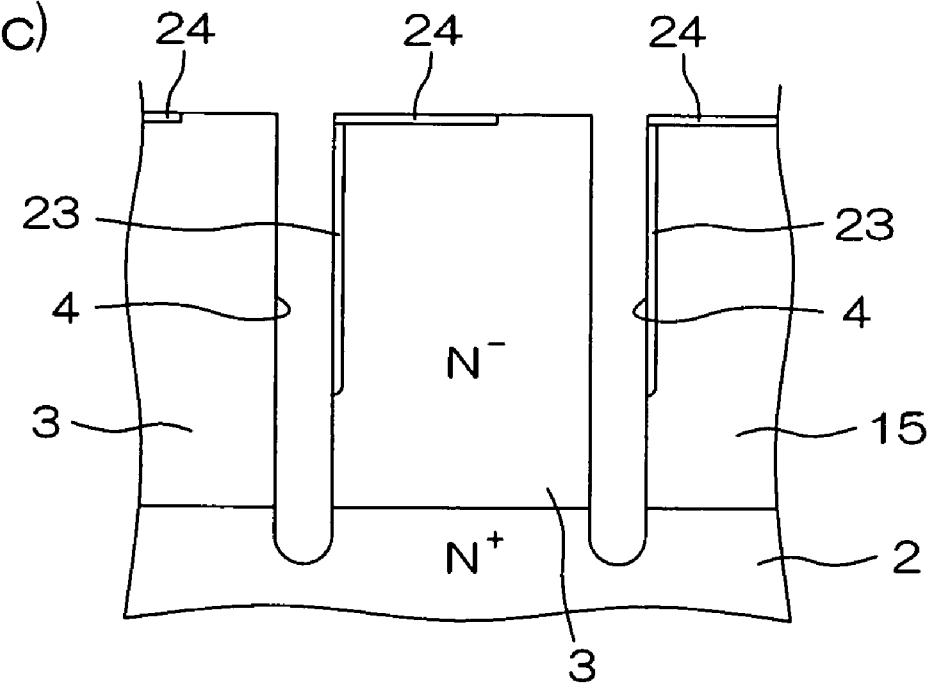

In turn, a P-type impurity is implanted into thin surface portions of the epitaxial layer 15 corresponding to the base regions 8 through the openings of the resist film, whereby second implanted regions 24 are formed. Thereafter, the resist film is removed. This state is shown in FIG. 2(c).

Figure 2D:
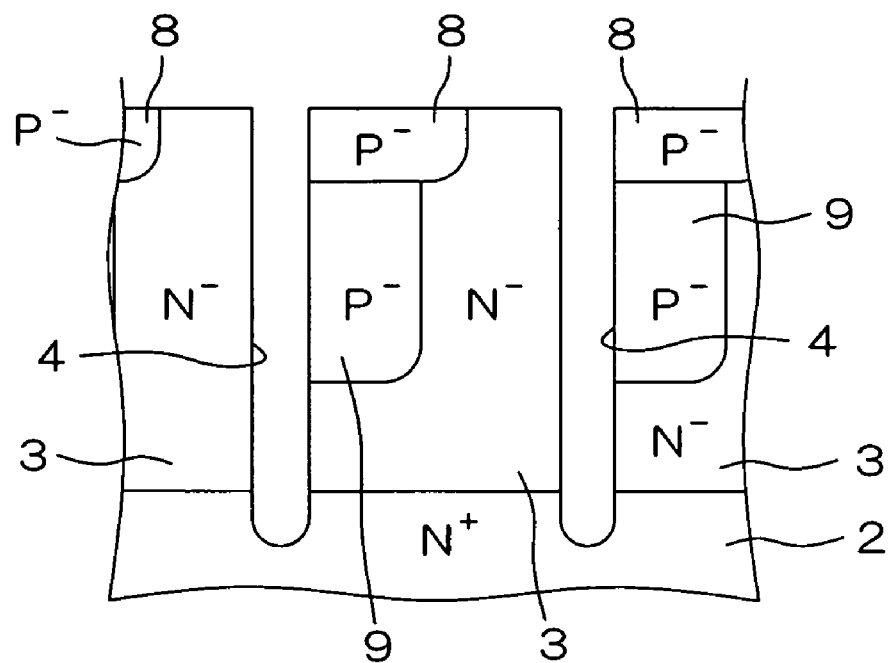

Subsequently, the resulting silicon substrate 2 is heated to a predetermined temperature, whereby the P-type impurities are diffused into the epitaxial layer 15 from the first and second implanted regions 23, 24. Thus, the RESURF layers 9 and the base regions 8 are formed. The remaining portions of the epitaxial layer 15 serve as the drift layers 3. This state is shown in FIG. 2(d).

Figure 2E:
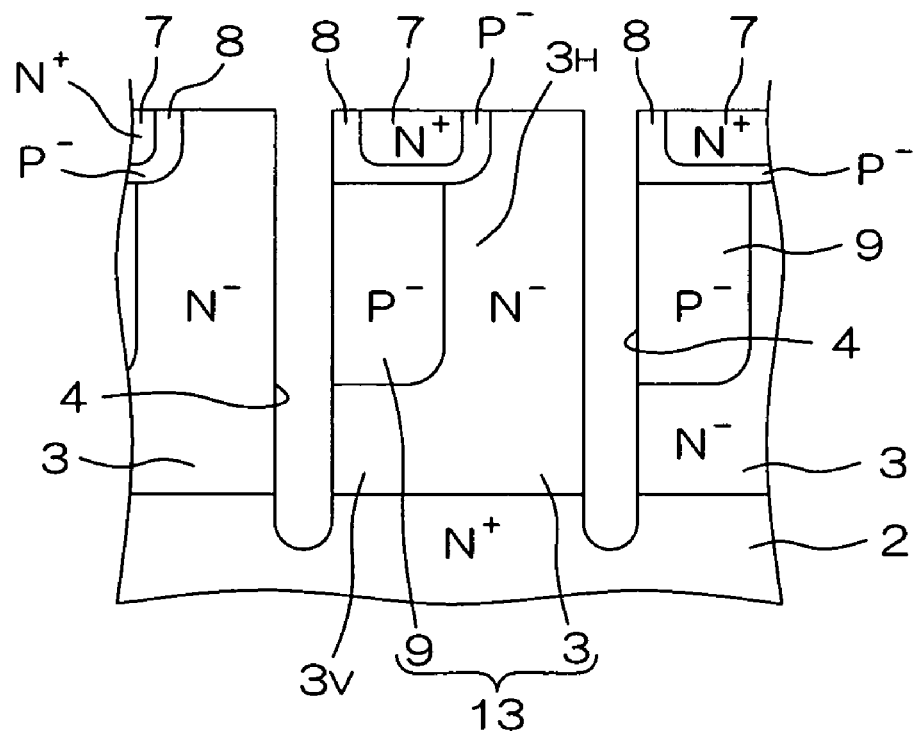

Next, a resist film (not shown) having openings formed in positions corresponding to the source regions 7 is formed on the drift layers 3 and the base regions 8. An impurity for control of impartation with an N-type conductivity is implanted into thin surface portions of the base regions 8 corresponding to the source regions 7 through the openings of the resist film, whereby third impurity implanted regions are formed. Thereafter, the resist film is removed, and the resulting silicon substrate 2 is heated to a predetermined temperature, whereby the N-type impurity is diffused into the base regions 8 from the third implanted regions. Thus, the source regions 7 are formed. This state is shown in FIG. 2(e).

In turn, the resulting silicon substrate 2 is heated to a predetermined temperature, whereby an exposed surface portion of the silicon substrate including interior surfaces of the trenches 4 and surfaces of the drift layers 3, the base regions 8 and the source regions 7 is thermally oxidized to form an oxide film. Further, a film of polysilicon (polysilicon film) is formed on the oxide film. Then, the polysilicon film is imparted with an electrical conductivity by implantation of an impurity.

Subsequently, a portion of the polysilicon film other than those corresponding to the insides of the trenches 4 and the gate electrodes 10 is removed, and exposed surface portions of the polysilicon film are thermally oxidized to form oxide films.

Then, the oxide films on the trenches 4 and the oxide films other than those on peripheral surfaces of the gate electrodes 10 outside the trenches 4 are removed. Thus, the portions of the polysilicon film remaining in the trenches 4 serve as the polysilicon portions 6, and the portions of the polysilicon film remaining outside the trenches 4 serve as the gate electrodes 10. The portions of the oxide film remaining in the trenches 4 serve as the silicon oxide films 5, and the oxide films remaining outside the trenches 4 serve as the silicon oxide films 11 covering the peripheral surfaces of the gate electrodes 10.

Thereafter, the source electrode 12 and the drain electrode 14 are respectively formed on a surface of the resulting silicon substrate 2 formed with the source regions 7 and on a surface of the substrate opposite from the source regions 7. Thus, the semiconductor device 1 shown in FIG. 1 is provided.

In the aforesaid production method, when the P-type impurity ions are implanted into the portions of the epitaxial layer 15 exposed to the interior surfaces of the trenches 22, the trenches 22 each have a depth such as not to reach the silicon substrate 2. Therefore, the P-type impurity is not introduced into portions of the epitaxial layer 15 adjacent to the silicon substrate 2. Thus, the RESURF layers 9 are isolated from the silicon substrate 2 by the drift layers 3.

The width $D_2$ of the isolation regions $3_V$ of the drift layers 3 of the semiconductor device 1 as measured vertically (a distance between each of the RESURF layers 9 and the silicon substrate 2 (drain region)) can be controlled by controlling the depth of the trenches 22 in the step of forming the trenches 22. Further, the width $D_1$ of the portions $3_H$ of the drift layers between the RESURF layers 9 and the trenches 4 as measured laterally (a distance between each of the RESURF layers 9 and the trenches 4) can be controlled by controlling conditions for heating the silicon substrate 2 (e.g., a temperature and a period for the heating). Thus, the width $D_1$ and the width $D_2$ can be substantially equalized with each other.

Figure 3:
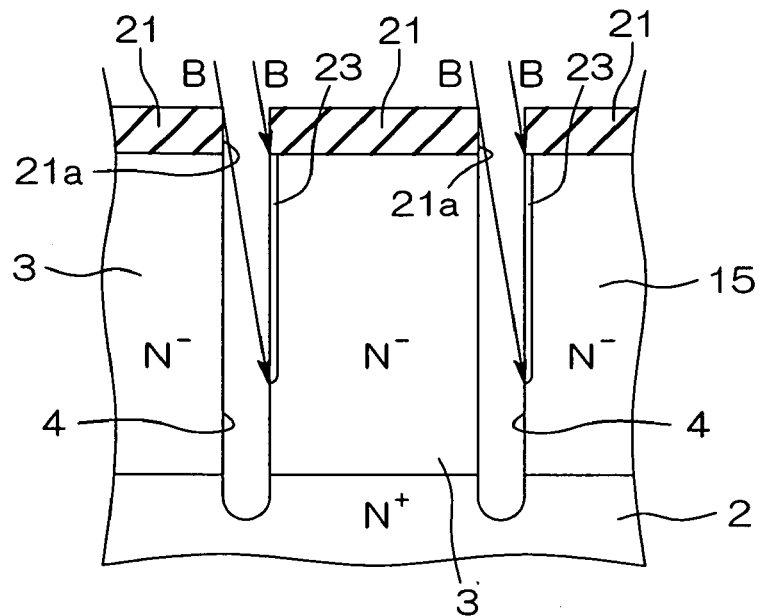
FIG. 3 is a schematic sectional view for explaining another production method for the semiconductor device of FIG. 1.

FIG. 3 is a schematic sectional view for explaining another production method for the semiconductor device 1. In FIG. 3, parts corresponding to those shown in FIGS. 2(a) to 2(e) will be denoted by the same reference characters as in FIGS. 2(a) to 2(e), and no explanation will be given to these parts.

This production method for the semiconductor device 1 differs from the semiconductor device production method described with reference to FIGS. 2(a) to 2(e) in that the trenches 4 are formed as having a depth such as to reach the silicon substrate 2 and then the P-type impurity ions are implanted at a predetermined angle (a very small inclination angle) with respect to the interior side walls of the trenches 4 perpendicular to the widths of the trenches 4 (longitudinal of the trenches 4) as indicated by arrows B in FIG. 3 through the openings 21a of the hard mask 21.

At this time, the first implanted regions 23 can be formed in portions of the interior side walls of the trenches 4 shallower than a predetermined depth by controlling the angle of the ion implantation direction with respect to the interior side walls of the trenches 4. This is because the ions advance straight to reach the interior walls of the trenches 4 and, if the angle of the ion implantation direction with respect to the interior side walls of the trenches 4 is increased to a certain level, the hard mask 21 prevents the ions from reaching deeper portions of the trenches 4.

Thereafter, the steps subsequent to the step of forming the second implanted regions 24 (see FIG. 2(c)) are performed in the same manner as in the aforesaid production method. Thus, the semiconductor device 1 shown in FIG. 1 is provided.

This production method also provides the semiconductor device 1 in which the RESURF layers 9 are isolated from the silicon substrate 2 by the drift layers 3 (by the isolation regions $3_V$).

At this time, the angle of the ion implantation direction with respect to the interior side walls of the trenches 4 is controlled to limit ion accessible ranges on the interior side walls of the trenches 4, whereby the first implanted regions 23 can be formed in controlled ranges. This makes it possible to control the width $D_2$ of the isolation regions $3_V$ of the drift layers 3 of the semiconductor device 1 as measured vertically (a distance between each of the RESURF layers 9 and the silicon substrate 2 (drain region)).

Figure 4:
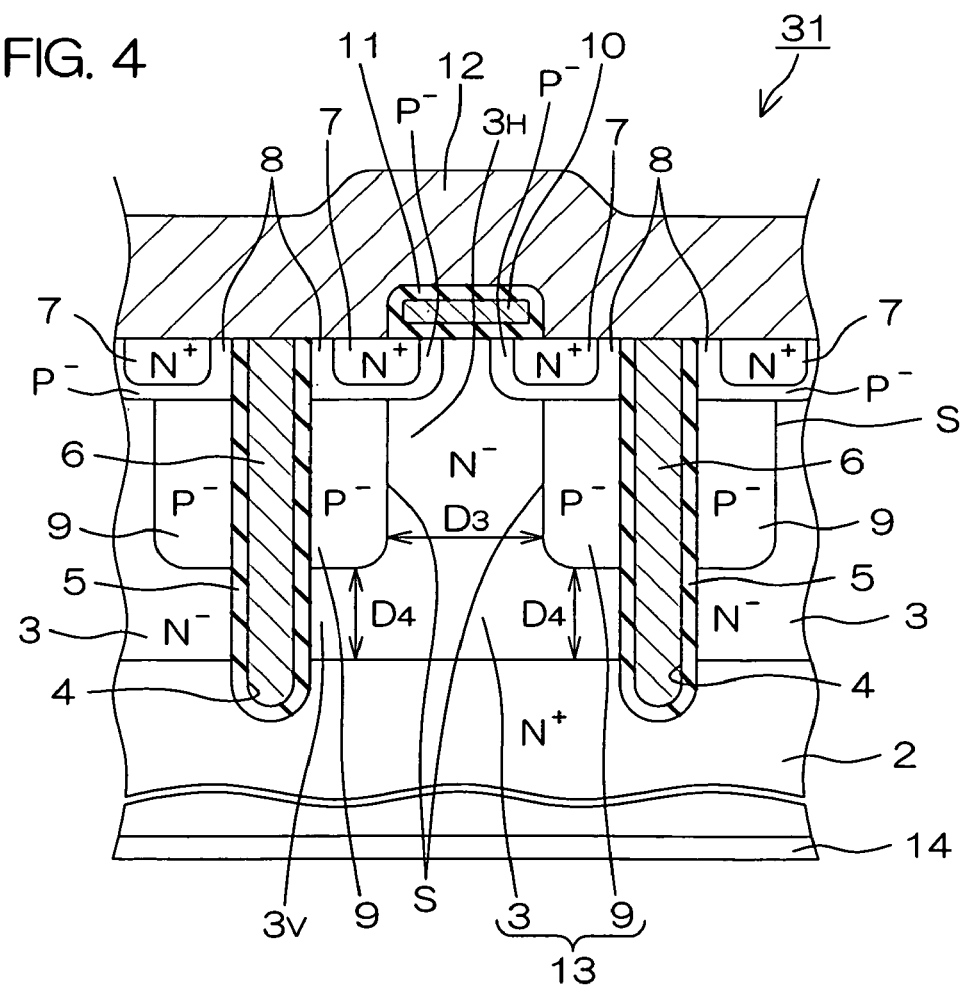
FIG. 4 is a schematic sectional view illustrating the construction of a semiconductor device according to a second embodiment of the present invention.
Figure 5:
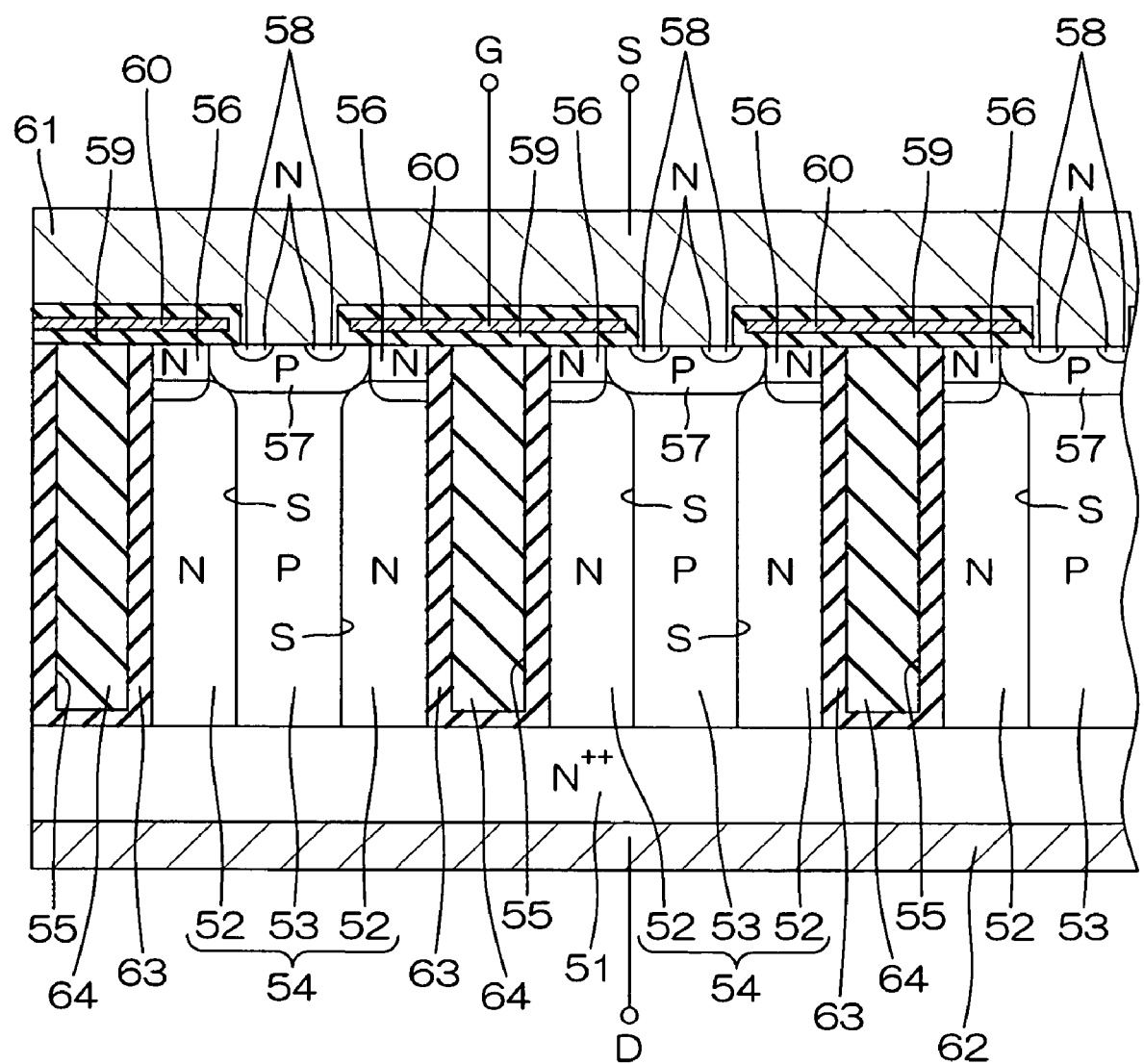
FIG. 5 is a schematic sectional view of a prior art semiconductor device including MOSFETs.

FIG. 4 is a schematic sectional view illustrating the construction of a semiconductor device according to a second embodiment of the present invention. In FIG. 4, parts corresponding to those shown in FIG. 1 will be denoted by the same reference characters as in FIG. 1, and no explanation will be given to these parts.

In this semiconductor device 31, the RESURF layers 9 are provided alongside the widthwise opposite interior side walls of each of the trenches.

The drift layers 3 are each disposed between two adjacent trenches 4, and each include a portion $3_H$ present between the RESURF layers 9 provided alongside the trenches 4 and isolation regions $3_V$ respectively present below the RESURF layers 9 to isolate the RESURF layers 9 from the silicon substrate 2 (drain region). Therefore, any portions of the RESURF layers 9 do not contact the silicon substrate 2. The width $D_3$ of the portion $3_H$ of the drift layer 3 present between the adjacent RESURF layers 9 as measured laterally (a distance between the two adjacent RESURF layers 9) is double the width $D_4$ of the isolation regions $3_V$ as measured vertically depthwise of the trenches 4 (a distance between each of the RESURF layers 9 and the silicon substrate 2 (drain region)).

When the semiconductor device 31 is on, channels are formed in the base regions 8 as in the semiconductor device 1, whereby electric currents flow between the source electrode 12 and the drain electrode 14. On the other hand, when the semiconductor device 31 is off, a higher reverse bias voltage is applied to the PN junctions defined between the drift layers 3 and the RESURF layers 9, and the depletion layers spread into the drift layers 3 and the RESURF layers 9 from the interfaces S between the drift layers 3 and the RESURF layers 9. Thus, the drift layers 3 and the RESURF layers 9 are completely depleted.

In each of the drift layers 3, the width $D_3$ is double the width $D_4$, so that the depletion layers spread to the same width toward the adjacent RESURF layers 9 and toward the silicon substrate 2 in the drift layer 3 from the interfaces S. Therefore, the depletion layers each constantly have an even field intensity, so that the semiconductor device 31 has a higher breakdown voltage.

The semiconductor device 31 can be produced by substantially the same production method as the production method for the semiconductor device 1 (see FIGS. 2(a) to 2(e) and FIG. 3). In the step of implanting the P-type impurity ions into the interior side walls of the trenches 22 or the trenches 4 (see FIG. 2(a) or FIG. 3), the ions are implanted in two directions which are inclined at a very small inclination angle with respect to the interior side walls of the trenches 4 and extend widthwise of the trenches 22, 4 (perpendicularly to the lengths of the trenches) as seen perpendicularly to the silicon substrate 2.

Thus, ion implanted regions (first implanted regions 23) are formed in the widthwise opposite interior side walls of the trenches 22, 4. Thereafter, the silicon substrate 2 is heated, whereby the P-type impurity is diffused into the epitaxial layer 15 from the implanted regions to form the RESURF layers 9.

While the embodiments of the present invention have thus been described, the invention may be embodied in any other ways. In the production method for the semiconductor device 1, the diffusion of the P-type impurity into the epitaxial layer 15 from the first implanted regions 23 and the diffusion of the P-type impurity into the epitaxial layer 15 from the second implanted regions 24 are simultaneously achieved, but are not necessarily required to be achieved simultaneously. For example, the diffusion of the P-type impurity into the epitaxial layer 15 from the first implanted regions 23 may be carried out immediately after the formation of the first implanted regions 23, and the formation of the second implanted regions 24 and the diffusion of the P-type impurity into the epitaxial layer 15 from the second implanted regions 24 may be thereafter carried out.

In the semiconductor device 31 according to the second embodiment, the RESURF layers 9 may also be provided alongside longitudinally opposite interior side walls of the trenches 4. That is, the RESURF layers 9 may be provided alongside all the interior side walls of the trenches 4.

In this case, the formation of the RESURF layers 9 may be achieved by implanting the P-type impurity into the epitaxial layer in four directions which are inclined at a very small inclination angle with respect to the interior side walls of the trenches 4 and extend perpendicularly to and parallel to the widths of the trenches 22, 4 as seen perpendicularly to the silicon substrate 2 to form implanted regions in all the interior side walls of the trenches 4, and then diffusing the P-type impurity into the epitaxial layer 15 from the implanted regions by the subsequent heating step.

While the present invention has been described in detail by way of the embodiments thereof, it should be understood that these embodiments are merely illustrative of the technical principles of the present invention but not limitative of the invention. The spirit and scope of the present invention are to be limited only by the appended claims.

This application corresponds to Japanese Patent Application No. 2003-435265 filed with the Japanese Patent Office on Dec. 26, 2003, the disclosure of which is incorporated herein by reference.

What is claimed is:

1. A semiconductor device, comprising:
a semiconductor substrate of a first conductivity; and
a semiconductor layer disposed on the semiconductor substrate, the semiconductor layer including
a trench penetrating through the semiconductor layer,
RESURF layers of a second conductivity different from the first conductivity, each RESURF layer being disposed adjacent to an interior side wall of the trench, and
drift layers of the first conductivity, each having an isolation portion disposed between each of the RESURF layers and the semiconductor substrate to prevent the RESURF layer from contacting the semiconductor substrate,
wherein the drift layers and the RESURF layers are disposed adjacent to each other in a direction parallel to the semiconductor substrate, each RESURF layer is in contact with at least one of the drift layers, and each of the drift layers is in contact with at least one of the RESURF layers.

2. A semiconductor device as set forth in claim 1, wherein the RESURF layers are each provided alongside one of widthwise opposite interior side walls of the trench,
the drift layers are each provided alongside the other of the widthwise opposite interior side walls of the trench, and
a width of a portion of the drift layer between the trench and the RESURF layer as measured laterally is nearly equal to a width of the isolation region as measured vertically depthwise of the trench.

3. A semiconductor device as set forth in claim 1, wherein the RESURF layers are provided alongside widthwise opposite interior side walls of the trenches, and
a width of a portion of the drift layer between two adjacent RESURF layers as measured laterally is generally double a width of the isolation region as measured vertically depthwise of the trench.

4. A semiconductor device as set forth in claim 1, further comprising:
base regions of the second conductivity each provided in contact with the drift layer and the RESURF layer;
source regions of the first conductivity each provided in contact with the base region and isolated from the drift layer and the RESURF layer by the base region; and
gate electrodes each provided in opposed relation to a portion of the base region between the source region and the drift layer with the intervention of a gate insulation film.

5. A production method for a semiconductor device which includes a semiconductor layer provided on a semiconductor substrate of a first conductivity and including drift layers of the first conductivity and RESURF layers of a second conductivity different from the first conductivity, the drift layers and the RESURF layers being disposed adjacent to each other in a direction parallel to the semiconductor substrate and such that each RESURF layer is in contact with at least one of the drift layers, and each of the drift layers is in contact with at least one of the RESURF layers, the production method comprising the steps of:
forming a semiconductor layer of the first conductivity on a semiconductor substrate of the first conductivity;
performing a first trench formation process to form a trench in the semiconductor layer, the trench having a depth such as to reach a middle of the semiconductor layer;
after the first trench formation step, performing an in-trench impurity introduction process to introduce an impurity of the second conductivity into a portion of the semiconductor layer exposed to an interior side wall of the trench for forming a RESURF layer of the second conductivity alongside the interior side wall of the trench; and
after the in-trench impurity introduction step, performing a second trench formation process to deepen the trench to a depth such as to penetrate through the semiconductor layer to reach the semiconductor substrate.

6. A production method for a semiconductor device which includes a semiconductor layer provided on a semiconductor substrate of a first conductivity, the semiconductor layer including drift layers of the first conductivity and RESURF layers of a second conductivity different from the first conductivity, the drift layers and the RESURF layers disposed adjacent to each other in a direction parallel to the semiconductor substrate and such that each RESURF layer is in contact with at least one of the drift layers, and each of the drift layers is in contact with at least one of the RESURF layers, the production method comprising the steps of:
forming a semiconductor layer of the first conductivity on a semiconductor substrate of the first conductivity;
forming a trench in the semiconductor layer, the trench penetrating through the semiconductor layer to reach the semiconductor substrate; and
performing an in-trench impurity introduction process to implant an impurity of the second conductivity at an inclination angle into a portion of the semiconductor layer exposed to an interior side wall of the trench for forming a RESURF layer of the second conductivity in the portion of the semiconductor layer alongside the interior side wall of the trench, the inclination angle being such that the impurity reaches a limited depthwise range of the interior side wall of the trench shallower than the semiconductor substrate.

7. A semiconductor device production method as set forth in claim 5, wherein
the in-trench impurity introduction step includes the step of performing an implantation process to implant the impurity of the second conductivity into a surface portion of the semiconductor layer exposed to the interior side wall of the trench,
the production method further comprising the step of performing a thermal diffusion process to heat the resulting semiconductor substrate after the implantation step for diffusing the implanted impurity into the semiconductor layer for the formation of the RESURF layer.

8. A semiconductor device production method as set forth in claim 5, further comprising the steps of:
introducing an impurity of the second conductivity into a surface portion of the semiconductor layer to form a base region of the second conductivity in contact with the RESURF layer;
introducing an impurity of the first conductivity into a portion of the base region to form a source region of the first conductivity which is isolated from the drift layer and the RESURF layer by a remaining portion of the base region;
forming a gate insulation film opposed to the portion of the base region between the source region and the drift layer; and
forming a gate electrode opposed to the portion of the base region between the source region and the drift layer with the intervention of the gate insulation film.

9. A semiconductor device as set forth in claim 2, further comprising:
- base regions of the second conductivity each provided in contact with the drift layer and the RESURF layer;
- source regions of the first conductivity each provided in contact with the base region and isolated from the drift layer and the RESURF layer by the base region; and
- gate electrodes each provided in opposed relation to a portion of the base region between the source region and the drift layer with the intervention of a gate insulation film.

10. A semiconductor device as set forth in claim 3, further comprising:
- base regions of the second conductivity each provided in contact with the drift layer and the RESURF layer;
- source regions of the first conductivity each provided in contact with the base region and isolated from the drift layer and the RESURF layer by the base region; and
- gate electrodes each provided in opposed relation to a portion of the base region between the source region and the drift layer with the intervention of a gate insulation film.

11. A semiconductor device production method as set forth in claim 6, wherein
- the in-trench impurity introduction step includes the step of performing an implantation process to implant the impurity of the second conductivity into a surface portion of the semiconductor layer exposed to the interior side wall of the trench,
- the production method further comprising the step of performing a thermal diffusion process to heat the resulting semiconductor substrate after the implantation step for diffusing the implanted impurity into the semiconductor layer for the formation of the RESURF layer.

12. A semiconductor device production method as set forth in claim 6, further comprising the steps of:
- introducing an impurity of the second conductivity into a surface portion of the semiconductor layer to form a base region of the second conductivity in contact with the RESURF layer;
- introducing an impurity of the first conductivity into a portion of the base region to form a source region of the first conductivity which is isolated from the drift layer and the RESURF layer by a remaining portion of the base region;
- forming a gate insulation film opposed to the portion of the base region between the source region and the drift layer; and
- forming a gate electrode opposed to the portion of the base region between the source region and the drift layer with the intervention of the gate insulation film.

13. A semiconductor device production method as set forth in claim 7, further comprising the steps of:
- introducing an impurity of the second conductivity into a surface portion of the semiconductor layer to form a base region of the second conductivity in contact with the RESURF layer;
- introducing an impurity of the first conductivity into a portion of the base region to form a source region of the first conductivity which is isolated from the drift layer and the RESURF layer by a remaining portion of the base region;
- forming a gate insulation film opposed to the portion of the base region between the source region and the drift layer; and
- forming a gate electrode opposed to the portion of the base region between the source region and the drift layer with the intervention of the gate insulation film.

14. A semiconductor device production method as set forth in claim 11, further comprising the steps of:
- introducing an impurity of the second conductivity into a surface portion of the semiconductor layer to form a base region of the second conductivity in contact with the RESURF layer;
- introducing an impurity of the first conductivity into a portion of the base region to form a source region of the first conductivity which is isolated from the drift layer and the RESURF layer by a remaining portion of the base region;
- forming a gate insulation film opposed to the portion of the base region between the source region and the drift layer; and
- forming a gate electrode opposed to the portion of the base region between the source region and the drift layer with the intervention of the gate insulation film.

\* \* \* \* \*

UNITED STATES PATENT AND TRADEMARK OFFICE
CERTIFICATE OF CORRECTION

PATENT NO. : 7,598,586 B2  Page 1 of 1
APPLICATION NO. : 10/577361
DATED : October 6, 2009
INVENTOR(S) : Masaru Takaishi It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 595 days.

Signed and Sealed this

Twenty-eighth Day of September, 2010

David J. Kappos
*Director of the United States Patent and Trademark Office*